United States Patent
Lee

(10) Patent No.: US 9,484,963 B2
(45) Date of Patent: Nov. 1, 2016

(54) MULTI-MODE AND MULTI-BAND FRONT-END DEVICE

(71) Applicant: AIROHA TECHNOLOGY CORP., Hsinchu (TW)

(72) Inventor: Chien-Kuang Lee, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 14/740,379

(22) Filed: Jun. 16, 2015

(65) Prior Publication Data
US 2016/0126984 A1   May 5, 2016

(30) Foreign Application Priority Data

Oct. 29, 2014   (TW) .............................. 103137461 A

(51) Int. Cl.
*H04B 7/02*   (2006.01)
*H04B 1/04*   (2006.01)
*H04B 1/00*   (2006.01)

(52) U.S. Cl.
CPC ................ *H04B 1/04* (2013.01); *H04B 1/006* (2013.01); *H04B 1/0483* (2013.01); *H04B 2001/0408* (2013.01)

(58) Field of Classification Search
CPC .................. H04B 1/04; H04B 1/0483; H04B 2001/0408; H04B 1/0458; H04B 1/0064; H04B 1/38; H04B 1/006; H04W 88/06; H01Q 5/335; H01Q 5/00; H03H 7/38; H03H 7/46; H03F 2200/111
USPC ...... 455/73, 83, 102; 330/302, 126, 124, 32; 375/297, 219; 343/852, 860; 333/124, 333/32, 101

See application file for complete search history.

(56) References Cited

U.S. PATENT DOCUMENTS

2009/0180403 A1* 7/2009 Tudosoiu ............... H04B 1/006 370/278

* cited by examiner

*Primary Examiner* — Rahel Guarino
(74) *Attorney, Agent, or Firm* — Rosenberg, Klein & Lee

(57) ABSTRACT

A multi-mode and multi-band front-end device comprises at least one amplifier unit, at least one switching unit, at least one control unit, a plurality of transmission paths, and a plurality of frequency matching networks. The switching unit comprises at least input end and a plurality of connecting ends. Wherein the input end is electrically connected to the amplifier unit, and each of connecting ends is connected to each of transmission paths, respectively. Each of frequency matching networks is configured on each of transmission paths, and achieves impedance matching at different frequency bands, respectively. The multi-mode and multi-band front-end device is able to select one of transmission paths to transmit RF signal according to the frequency band of RF signal to be transmitted so as to improve the output power of the multi-mode and multi-band front-end device.

20 Claims, 10 Drawing Sheets

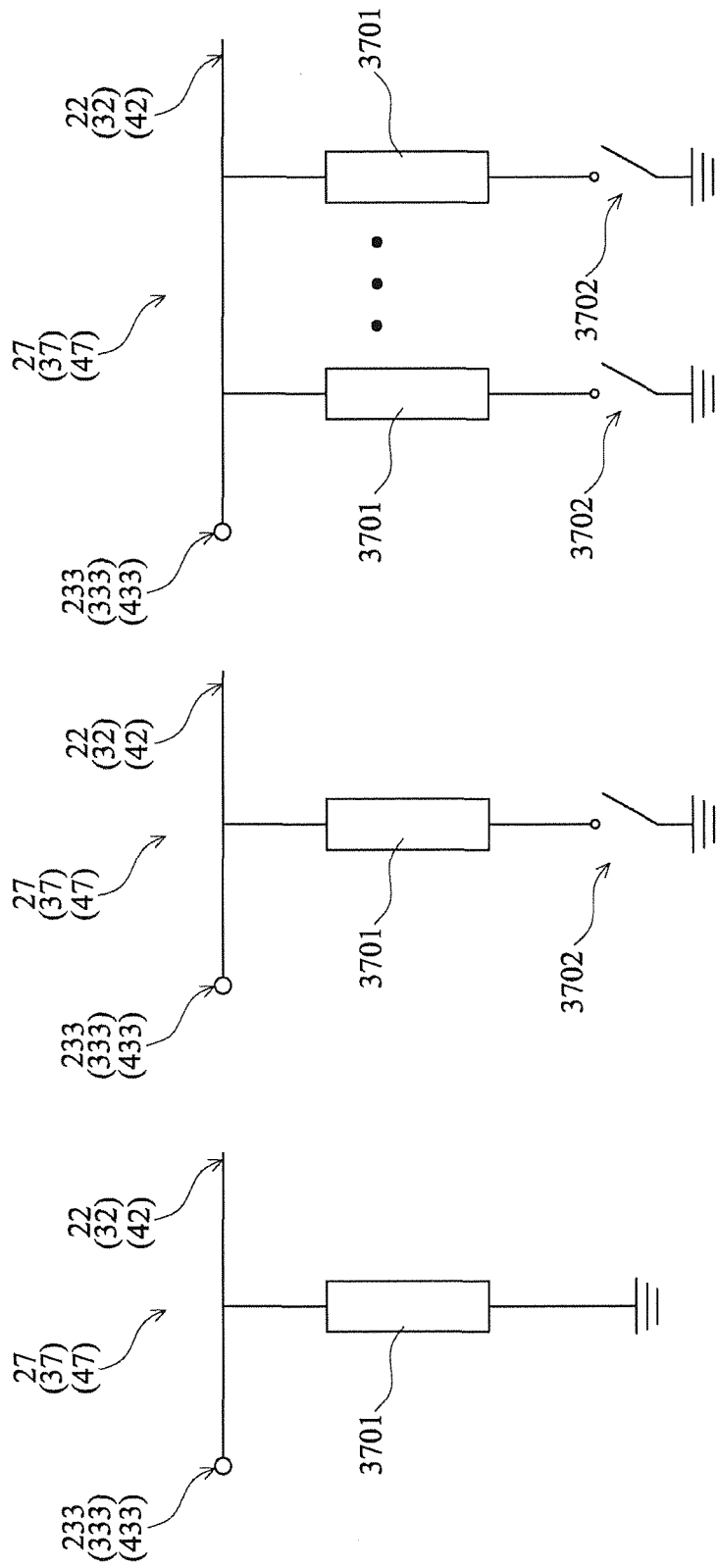

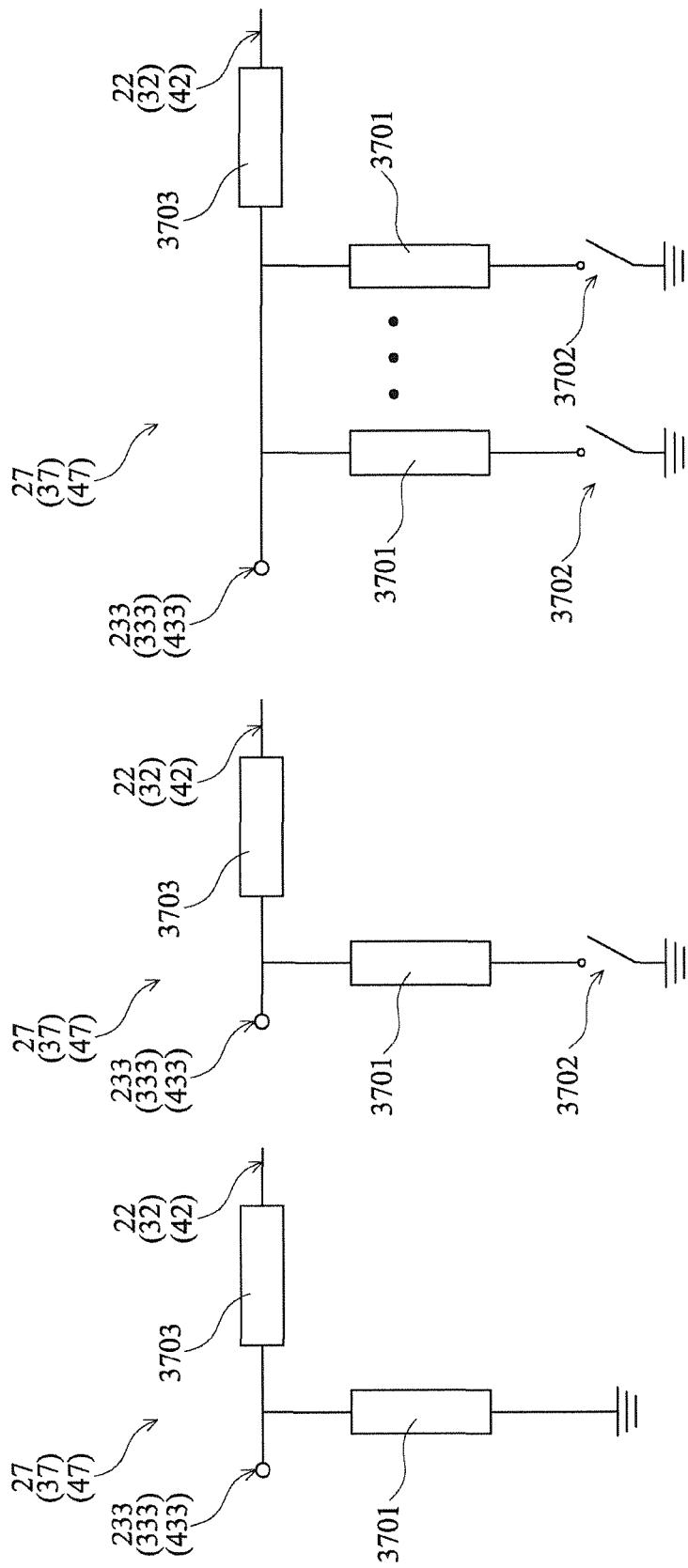

MULTI-MODE AND MULTI-BAND FRONT-END DEVICE

CROSS-REFERENCE TO RELATED APPLICATIONS

This non-provisional application claims priority claim under 35 U.S.C. §119(a) on Taiwan Patent Application No. 103137461 filed Oct. 29, 2014, the entire contents of which are incorporated herein by reference.

FIELD OF THE INVENTION

The present invention is related to a multi-mode and multi-band front-end device, which is able to select one of transmission paths to transmit RF signal according to the frequency band of RF signal so as to improve the output power of the multi-mode and multi-band front-end device.

BACKGROUND

As technologies advance, the specifications of mobile communication technologies are along with upgrade. For example, the transmission technologies are evolved from 2G to 3G or 4G so that the speed of mobile communications may be promoted quickly. However, different mobile communication technologies will operate in different band and mode, such that next-generation communication device with multi-mode and multi-band function is designed and produced by communication device manufacturer so as to meet the market requirement.

Referring to FIG. 1, there is shown a circuit connection diagram of a conventional multi-mode and multi-band front-end device. As shown FIG. 1, the multi-mode and multi-band front-end device 10 comprises an amplifier unit 11, a switching unit 13, a control unit 15 and a wideband matching circuit 17. Wherein the amplifier unit 11 is connected to the switching unit 13 via the wideband matching circuit 17, and the control unit 15 is connected to the amplifier unit 11 and the switching unit 13, respectively.

The switching unit 13 comprises an input end 131 and a plurality of connecting ends 133. Wherein the input end 131 is connected to the amplifier unit 11 via the wideband matching circuit 17, and each of connecting ends 133 is connected to one transmission path 12, respectively. In practical application, an signal amplified by the amplifier unit 11 is transmitted to the input end 131 of the switching unit 13 via the wideband matching circuit 17, and the switching unit 13 is able to selectively transmit the amplified signal to one of the transmission paths 12 according to the frequency band of the amplified signal, such as the control unit 15 controls and switches the switching unit 13.

The wideband matching circuit 17 is usually designed to have characteristics of impedance matching with wide band signals, for example, signals from 2300 MHz to 2700 MHz band, so as to achieve the requirement of the conventional front-end device 10 conforming to multi-mode and multi-band. However, Q (quality factor) of the wideband matching circuit 17 can't be too high in order to achieve the object of wideband operation. Therefore, the transmitted signal passes through wideband matching circuit 17 will have more power loss compared to conventional narrow band matching design. The output power and PAE of the the multi-mode and multi-band front-end device 10 are then degraded due to the wideband matching loss.

SUMMARY

It is one object of the present invention to provide a multi-mode and multi-band front-end device, in which comprises an amplifier unit, a switching unit, and a plurality of frequency matching networks. Wherein the frequency matching networks may be impedance matched to the required impedances of the different frequency bands. The switching unit comprises an input end and a plurality of connecting end. Wherein the input end is electrically connected to the amplifier unit, and each connecting end is connected to each corresponding matching network, respectively. The multi-mode and multi-band front-end device can be used to switch the switching unit according to the operating frequency band, and the better impedance matching of the operating frequency band can be achieved by using the appropriate frequency matching network so as to improve the output power of the multi-mode and multi-band front-end device.

It is another object of the present invention to provide a multi-mode and multi-band front-end device, in which comprises a plurality of frequency matching networks. Wherein the frequency matching networks may be impedance matched to the required impedances of the different frequency bands. One of the frequency matching networks can be selected to transmit signal during the transmission of signal according to the frequency band of signal to be transmitted, such that the output power of the multi-mode and multi-band front-end device may be increased.

It is another object of the present invention to provide a multi-mode and multi-band front-end device, in which comprises a plurality of frequency matching networks. Wherein the frequency matching networks may be impedance matched to the required impedances of the different frequency bands, respectively, and the impedances of the frequency matching networks may be adjusted according to the frequency band of signal. One of the frequency matching networks can be selected and the impedances of the selected frequency matching network can be adjusted during the transmission of signal according to the operating frequency band, such that the output power of the multi-mode and multi-band front-end device may be increased.

It is another object of the present invention to provide a multi-mode and multi-band front-end device, in which comprises a plurality of frequency matching networks. Wherein the frequency matching networks may be impedance matched to the required impedances of the different frequency bands, respectively. When the multi-mode and multi-band front-end device is receiving or transmitting signal, One of the frequency matching networks will be selected according to the operating frequency band, such that the output power of the multi-mode and multi-band front-end device may be increased.

To achieve above objects, the present invention provides a multi-mode and multi-band front-end device, used for transmitting RF signal, comprising: an amplifier unit; a switching unit, comprising at least one input end and a plurality of connecting ends, wherein the input end of the switching unit is electrically connected to the amplifier unit; a control unit, connected to the amplifier unit and the switching unit, and used for controlling the amplifier unit and the switching unit; a plurality of transmission paths, connected to the connecting ends of the switching unit, respectively; and a plurality of frequency matching networks, configured on each of the transmission paths, respectively, wherein each of the frequency matching networks is impedance matched to the required impedances of different frequency bands, respectively.

The present invention further provides a multi-mode and multi-band front-end device, used for transmitting RF signal, comprising: an amplifier unit; a switching module, comprising: a switching unit, comprising an input end and a plurality of connecting ends, wherein the input end of the switching unit is electrically connected to the amplifier unit; a plurality of transmission paths, connected to the connecting ends of the switching unit, respectively; and a plurality of frequency matching networks, configured on each of the transmission paths, respectively, wherein each of the frequency matching networks is impedance matched to the required impedances of different frequency bands, respectively; and at least one control unit, connected to the amplifier unit and the switching module.

The present invention further provides a multi-mode and multi-band front-end device used for transmitting and receiving RF signal, comprising: an amplifier unit; a switching module, comprising: a switching unit, comprising an input end and a plurality of connecting ends, wherein the input end of the switching unit is electrically connected to the amplifier unit; a plurality of transmission paths, connected to the connecting ends of the switching unit, respectively; and a plurality of frequency and transceiver matching networks, configured on each of the transmission paths, respectively, wherein each of the frequency and transceiver matching networks is impedance matched to the required impedances of different frequency bands, respectively; and a plurality of reception paths, connected to each of the transmission paths, respectively; and at least one control unit, connected to the amplifier unit and the switching module.

In one embodiment of the present invention, wherein each of the frequency matching networks comprises at least one first passive element connected at one end thereof to the corresponding transmission path.

In one embodiment of the present invention, wherein each of the frequency matching networks comprises at least one second passive element configured on the corresponding transmission path.

In one embodiment of the present invention, wherein the first passive element and the second passive element are capacitors, inductors or resistors.

In one embodiment of the present invention, wherein the first passive element is connected to the corresponding transmission path or grounding end via a switch, and the switch is for controlling the first passive element electrically connected to the corresponding transmission path or grounding end so as to adjust the impedances of the frequency matching networks.

In one embodiment of the present invention, wherein each of the reception paths is electrical connected to each of the transmission paths via a switch, respectively.

In one embodiment of the present invention, wherein impedances of the frequency and transceiver matching networks may be adjusted according to the frequency band of the RF signal.

In one embodiment of the present invention, wherein impedances of the frequency matching networks may be adjusted according to the frequency band of the RF signal.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which:

FIGS. 8A to 8C are each circuit connection diagram of a frequency matching network and a frequency and transceiver matching network of a multi-mode and multi-band front-end device according to one embodiment of the present invention, respectively.

FIGS. 9A to 9C are each circuit connection diagram of a frequency matching network and a frequency and transceiver matching network of a multi-mode and multi-band front-end device according to another embodiment of the present invention, respectively.

DETAILED DESCRIPTION OF THE PREFERRED EMBODIMENTS

Figure 2:
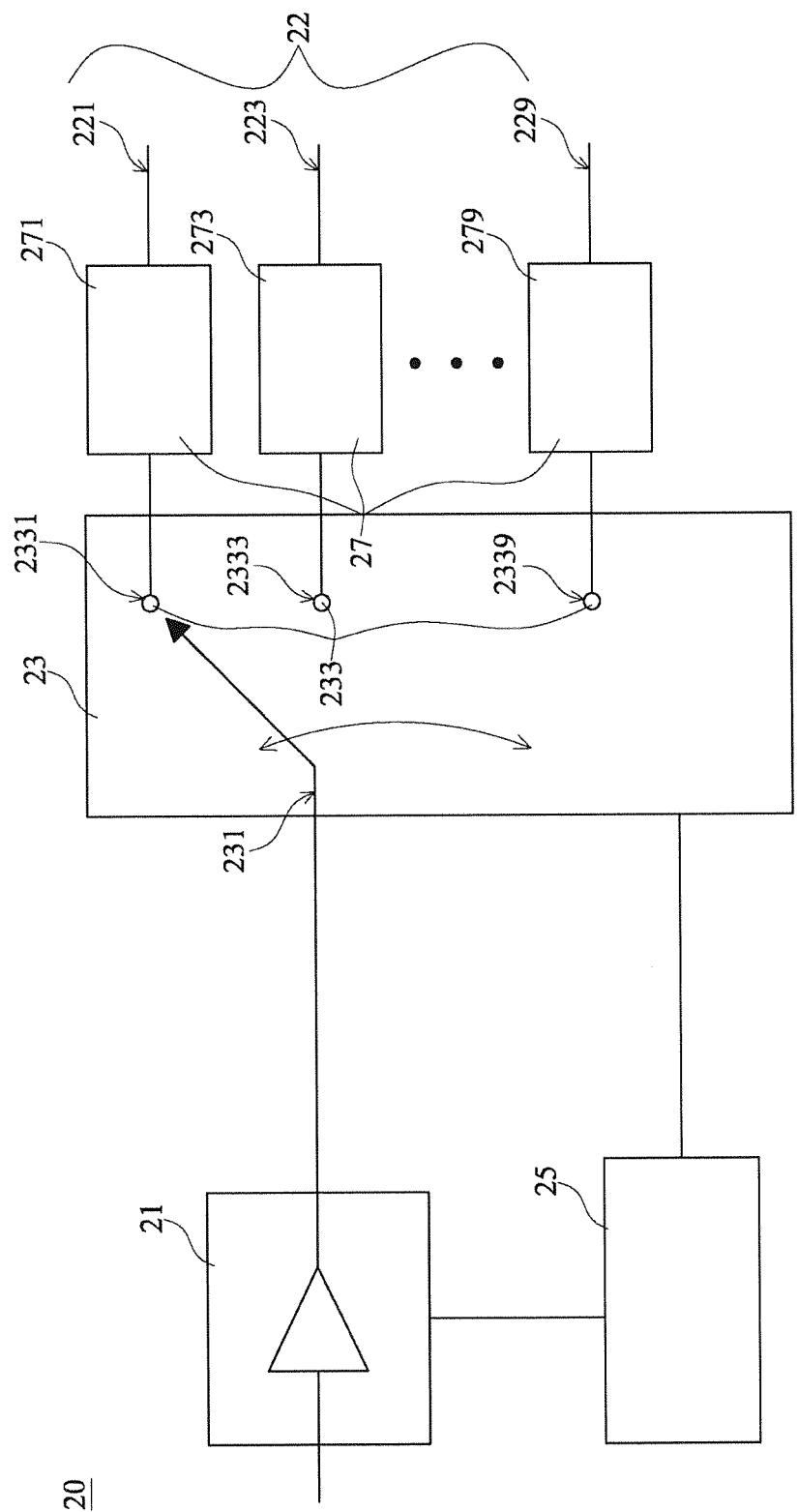
FIG. 2 is a circuit connection diagram of a multi-mode and multi-band front-end device according to one embodiment of the present invention.

Referring to FIG. 2, there is shown a circuit connection diagram of a multi-mode and multi-band front-end device according to one embodiment of the present invention. The multi-mode and multi-band front-end device 20 of the present invention is used for transmitting RF signal, and comprises an amplifier unit 21, a plurality of transmission paths 22, a switching unit 23, a control unit 25 and a plurality of frequency matching networks 27. The amplifier unit 21 is connected to the switching unit 23, and transmits the amplified RF signal to the switching unit 23. The control unit 25 is connected to the amplifier unit 21 and the switching unit 23, and used for controlling the amplifier unit 21 and the switching unit 23.

In one embodiment of the present invention, the switching unit 23 comprises an input end 231 and a plurality of connecting ends 233. Wherein the input end 231 is selectively connected to one of connecting ends 233 by the means of the switching unit 23. The input end 231 of the switching unit 23 is electrically connected to the amplifier unit 21, and the plurality of connecting ends 233 are connected to each of transmission paths 22, respectively. The input end 231 of the switching unit 23 may receive the amplified RF signal from the amplifier unit 21, and then transmit the amplified RF signal to one of connecting ends 233 and/or one of transmission paths 22.

The impedances of each of frequency matching networks 27 are with respect to the frequency band of transmitting signal and matched to the required impedances of the different frequency bands, respectively, so that the signals at different frequency bands pass the frequency matching networks 27 can have maximum transmission power, respectively. For example, the plurality of frequency matching networks 27 comprise a first frequency matching network 271, a second frequency matching network 272, . . . , and an $n^{th}$ frequency matching network 279. Wherein the first frequency matching network 271 is impedance matched to the required impedance of the first frequency band for maximum transmission power, the second frequency matching network 272 is impedance matched to the required impedance of the second frequency band for maximum transmission power, and the $n^{th}$ frequency matching network 279 is impedance matched to the required impedance of the $n^{th}$ frequency band for maximum transmission power.

In one embodiment of the present invention, each of frequency matching networks 27 is configured on each of transmission paths 22, respectively, so as to make each of frequency matching networks 27 connected to each of connecting ends 233 of the switching unit 23, respectively. For example, the first frequency matching network 271 is configured on a first transmission path 221 and connected to a first connecting end 2331, the second frequency matching network 273 is configured on a second transmission path 223 and connected to a second connecting end 2333, and the $n^{th}$ frequency matching network 279 is configured on an $n^{th}$ transmission path 229 and connected to an $n^{th}$ connecting end 2339.

When the multi-mode and multi-band front-end device 20 is operating at the first frequency band, the amplifier unit 21 will transmit the amplified RF signal at the first frequency band to the input end 231 of the switching unit 23, and the input end 231 will be connected to the first connecting end 2331 by the switching of the switching unit 23. For example, the switching unit 23 is switched by the controlling of the control unit 25 so as to make the amplifier unit 21 electrically connected to the first frequency matching network 271 configured on the first transmission path 221 via the switching unit 23, and transmit the amplified RF signal at the first frequency band to the first transmission path 221 and/or the first frequency matching network 271. Due to the first frequency matching network 271 being capable of impedance matched to the required impedance of the first frequency band, it will effectively decrease the loss of transmission of the RF signal at the first frequency band so as to improve the efficiency or/and the output power of the RF signal at the first frequency band transmitted by the first amplifier unit 21.

When the multi-mode and multi-band front-end device 20 is operating at the second frequency band, the amplifier unit 21 will transmit the amplified RF signal at the second frequency band to the input end 231 of the switching unit 23, and the input end 231 will be connected to the second connecting end 2333 by the switching of the switching unit 23. For example, the switching unit 23 is switched by the controlling of the control unit 25 so as to make the amplifier unit 21 electrically connected to the second frequency matching network 273 configured on the second transmission path 223 via the switching unit 23, and transmit the amplified RF signal at the second frequency band to the second transmission path 223 and/or the second frequency matching network 273. When the multi-mode and multi-band front-end device 20 is operating at the $n^{th}$ frequency band, the amplifier unit 21 will transmit the amplified RF signal at the $n^{th}$ frequency band to the input end 231 of the switching unit 23, and the input end 231 will be connected to the $n^{th}$ connecting end 2339 by the switching of the switching unit 23. For example, the switching unit 23 is switched by the controlling of the control unit 25 so as to make the amplifier unit 21 electrically connected to the $n^{th}$ frequency matching network 279 configured on the $n^{th}$ transmission path 229 via the switching unit 23, and transmit the amplified RF signal at the $n^{th}$ frequency band to the $n^{th}$ transmission path 229 and/or the $n^{th}$ frequency matching network 279. Due to the second frequency matching network 273 and the $n^{th}$ frequency matching network 279 being capable of impedance matched to the required impedance of the second frequency band and the RF signal at the $n^{th}$ frequency band, respectively, they will effectively decrease the transmission loss of the RF signal at the second frequency band and the RF signal at the $n^{th}$ frequency band so as to improve the efficiency or/and the output power of the RF signal at the second frequency and the RF signal at the $n^{th}$ frequency band transmitted by the first amplifier unit 21.

In one embodiment of the present invention, the characteristics of the amplifier unit 21 may be adjusted and the switching unit 23 may be switched by the control of the control unit 25. For example, the control unit 25 may used for adjusting the gain or bias of the amplifier unit 21, switching the switching unit 23 according to the frequency band of the RF signal had been amplified by the amplifier unit 21, so as to provide with the appropriate transmission path 22 and the appropriate frequency matching network 27 to transmit the RF signal.

Figure 1:
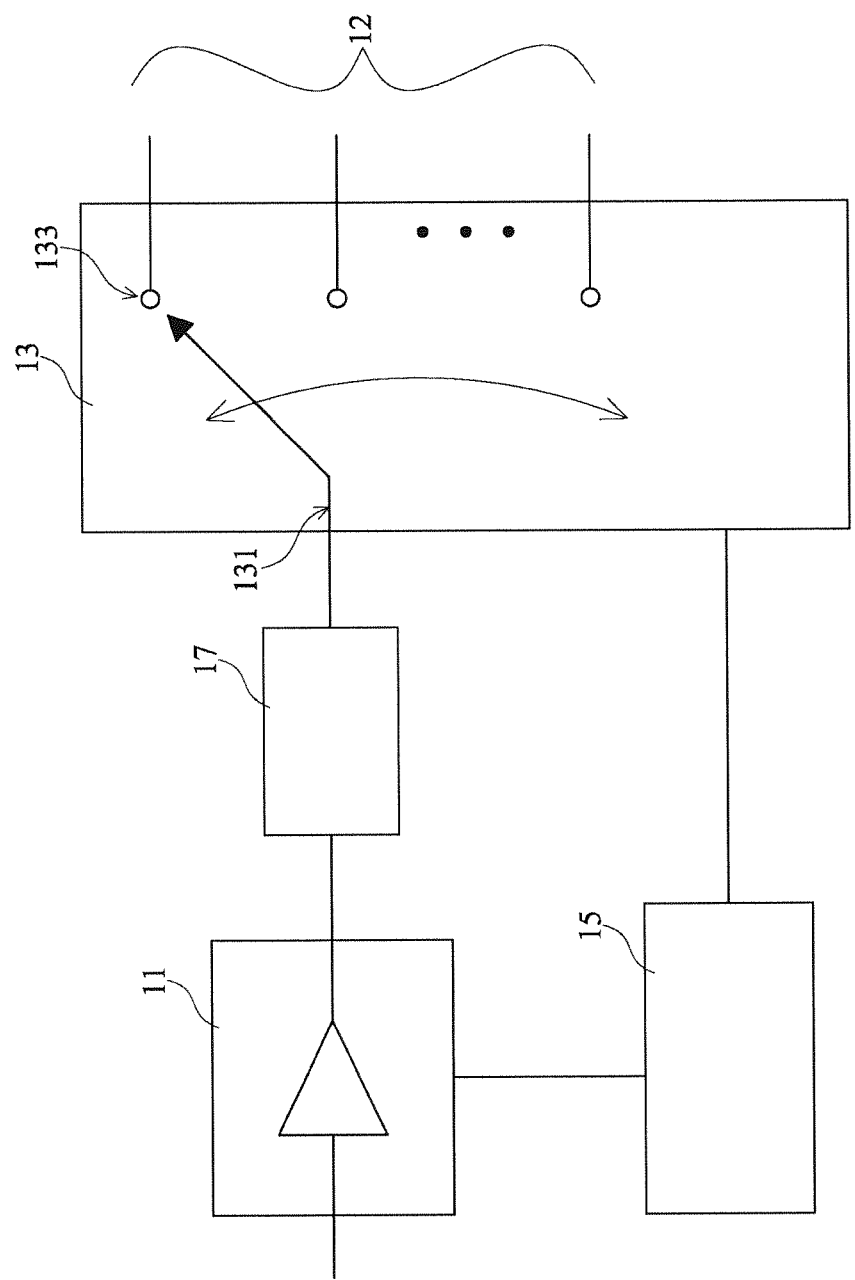
FIG. 1 is a circuit connection diagram of a conventional multi-mode and multi-band front-end device.

The conventional wideband matching circuit 17 in FIG. 1 is appropriate for transmitting the wide band signals, for example, the wide band signals at 2300 MHz to 2700 MHz band; however, Q (quality factor) of the wideband matching circuit 17 can not be too high in order to achieve the object of wideband operation. The design of low Q will cause larger loss of signal transmitted through the wideband matching circuit 17, and therefore unfavorable to improve the output power of the multi-mode and multi-band front-end device 10. By comparison, the multi-mode and multi-band front-end device 20 in FIG. 2 of the present invention may be provided with the plurality of frequency matching networks 27 and the plurality of transmission paths 22, and may select the appropriate transmission path 22 and the appropriate frequency matching network 27 to transmit the RF signal according to the frequency band of the RF signal. Besides, the high Q design can be achieved in the device 20 of the present invention since each of frequency matching networks 27 only needs to match a narrow frequency band, for example, the first frequency matching networks 271 only needs to match the frequency band of 2300~2400 MHz, the second frequency matching networks 272 only needs to match the frequency band of 2570~2620 MHz, and the $n^{th}$ frequency matching networks 279 only needs to match the frequency band of 2496~2690 MHz, such that the signal loss of the matching networks 27 can be significantly reduced so as to make the multi-mode and multi-band front-end device 20 and/or the amplifier unit 21 are having the better output power and efficiency.

For the convenience of description, taking three connecting ends 233, three transmission paths 22 and three frequency matching networks 27 as one example in the present invention; otherwise, the number of the connecting ends 233, the transmission paths 22 and the frequency matching networks 27 may be two or more than three in other example of the present invention. In one embodiment of the present invention, the number of the connecting ends 233, the transmission paths 22, and the frequency matching networks 27 may be decided according to the frequency band of signal to be transmitted by the multi-mode and multi-band front-end device 20.

Figure 3:
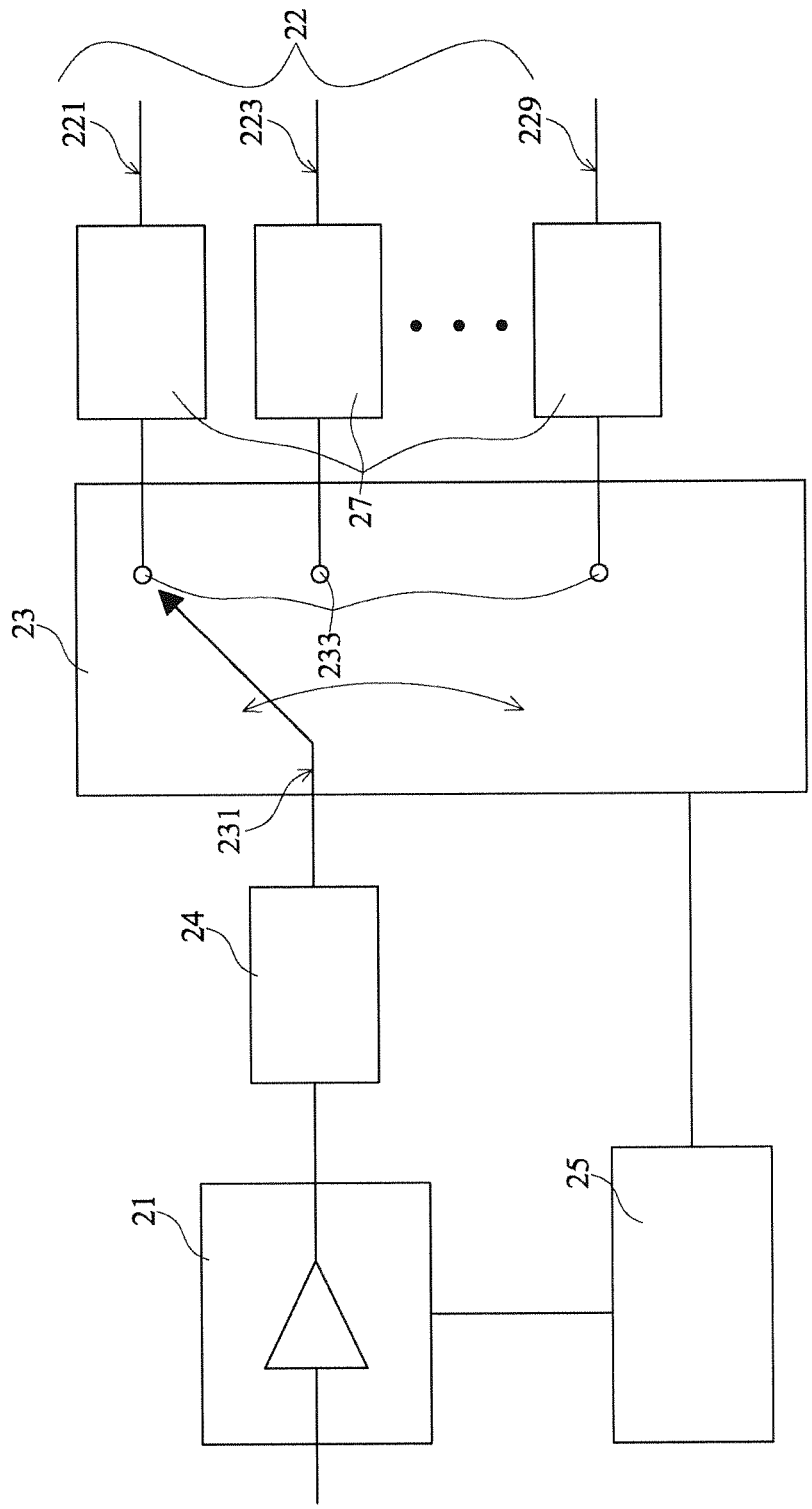
FIG. 3 is a circuit connection diagram of a multi-mode and multi-band front-end device according to another embodiment of the present invention.

In another embodiment of the present invention, as shown in FIG. 3, at least one matching network 24 is further configured between the amplifier unit 21 and the input end 231 of the switching unit 23. The output power and the efficiency of the multi-mode and multi-band front-end device 20 and/or the amplifier unit 21 can be improved by the using of the matching network 24 and the frequency matching networks 27.

The frequency matching networks 27 of the above-described embodiment of the present invention comprise at least one capacitor, and/or at least one inductor, and/or at least one resistor, and/or at least one switch. Wherein the impedances of the frequency matching networks 27 may be fixed or adjusted. The detailed contents will be described in subsequent embodiments.

Figure 4:
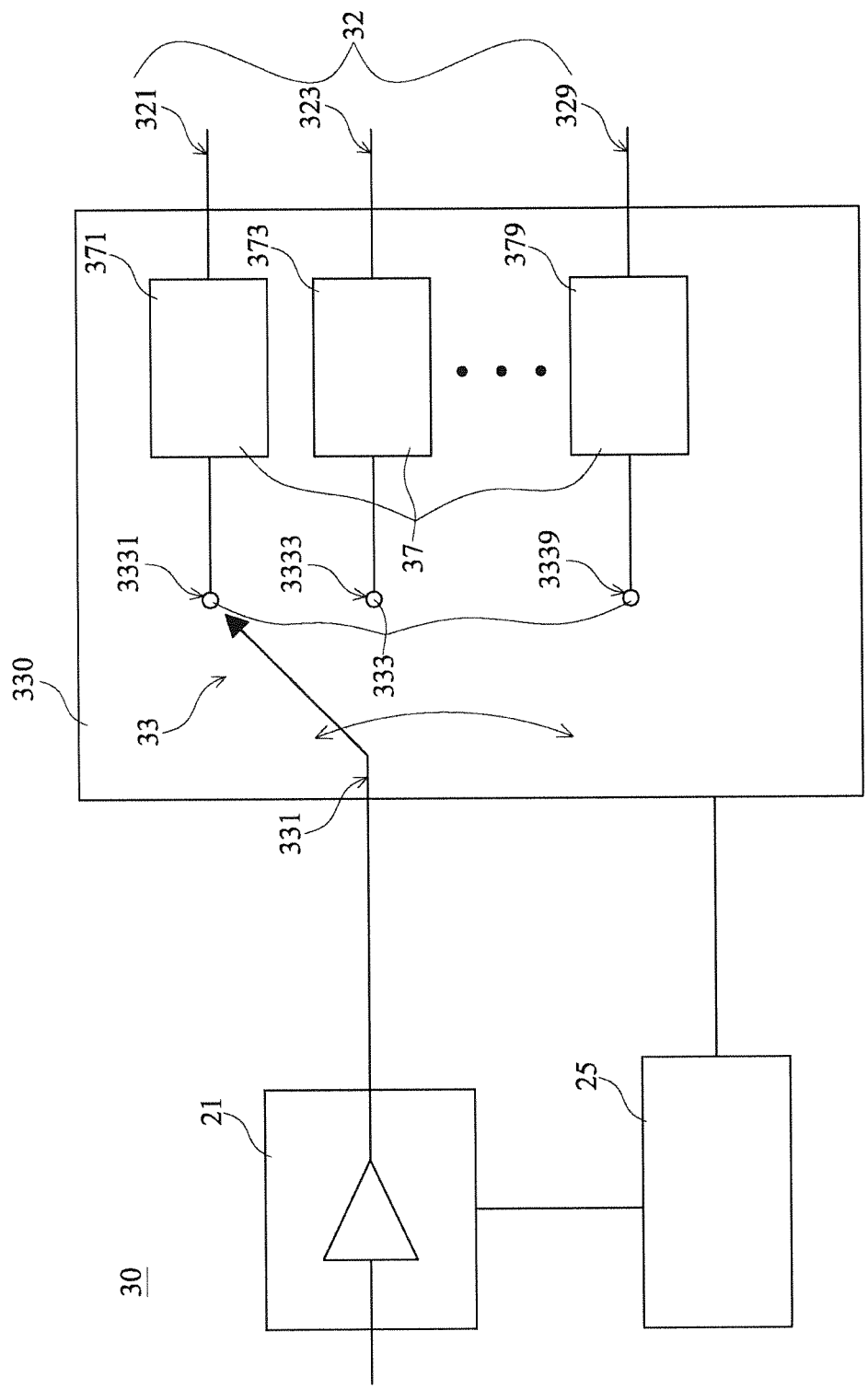
FIG. 4 is a circuit connection diagram of a multi-mode and multi-band front-end device according to another embodiment of the present invention.

Referring to FIG. 4, there is shown a circuit connection diagram of a multi-mode and multi-band front-end device according to another embodiment of the present invention. The multi-mode and multi-band front-end device 30 of the present invention is used for transmitting RF signal, and comprises an amplifier unit 21, a switching module 330 and a control unit 25. Wherein the amplifier unit 21 is connected to the switching module 330, and transmits the amplified RF signal to the switching module 330. The control unit 25 is connected to the amplifier unit 21 and the switching module 330, and for controlling the amplifier unit 21 and the switching module 330.

The switching module 330 of the embodiment of the present invention comprises a switching unit 33, a plurality of transmission paths 32 and a plurality of frequency matching networks 37. Wherein the switching unit 33 comprises an input end 331 and a plurality of connecting ends 333. The input end 331 of the switching unit 33 is connected to the amplifier unit 21, and each of connecting ends 333 of the switching unit 33 is connected to each of transmission paths 32, respectively.

The impedance of each of frequency matching networks 37 is matched to the required impedances of the different frequency bands, respectively, so that the signals at different frequency bands may pass the frequency matching networks 37, respectively. For example, the plurality of frequency matching networks 37 comprise a first frequency matching network 371, a second frequency matching network 372, . . . , and an $n^{th}$ frequency matching network 379. Wherein the first frequency matching network 371 is impedance matched to the required impedance of the first frequency band, the second frequency matching network 372 is impedance matched to the required impedance of the second frequency band, and the $n^{th}$ frequency matching network 379 is impedance matched to the required impedance of the $n^{th}$ frequency band.

In one embodiment of the present invention, each of frequency matching networks 37 is configured on each of transmission paths 32, respectively, to make each of frequency matching networks 37 being connected to each of connecting ends 333 of the switching unit 33, respectively. For example, the first frequency matching network 371 is configured on a first transmission path 321 and connected to a first connecting end 3331, the second frequency matching network 373 is configured on a second transmission path 323 and connected to a second connecting end 3333, and the $n^{th}$ frequency matching network 379 is configured on an $n^{th}$ transmission path 329 and connected to an $n^{th}$ connecting end 3339.

In one embodiment of the present invention, when the multi-mode and multi-band front-end device 30 is operating at the first frequency band, the amplifier unit 21 will transmit the amplified RF signal at the first frequency band to the input end 331 of the switching module 330, and the input end 331 will be connected to the first connecting end 3331 by the switching of the switching unit 33 within the switching module 330. For example, the switching module 330 and/or the switching unit 33 is switched by the controlling of the control unit 25 to make the amplifier unit 21 electrically connected to the first frequency matching network 371 configured on the first transmission path 321 via the switching unit 33. When the multi-mode and multi-band front-end device 30 is operating at the second frequency band, the amplifier unit 21 will transmit the amplified RF signal at the second frequency band to the input end 331 of the switching module 330, and the input end 331 will be connected to the second connecting end 3333 by the switching of the switching unit 33 within the switching module 330. For example, the switching module 330 and/or the switching unit 33 is switched by the controlling of the control unit 25 to make the amplifier unit 21 electrically connected to the second frequency matching network 373 configured on the second transmission path 323 via the switching unit 33. When the multi-mode and multi-band front-end device 30 is operating at the $n^{th}$ frequency band, the amplifier unit 21 will transmit the amplified RF signal at the $n^{th}$ frequency band to the input end 331 of the switching module 330, and the input end 331 will be connected to the $n^{th}$ connecting end 3339 by the switching of the switching unit 33 within the switching module 330. For example, the switching module 330 and/or the switching unit 33 is switched by the controlling of the control unit 25 to make the amplifier unit 21 electrically connected to the $n^{th}$ frequency matching network 379 configured on the $n^{th}$ transmission path 329 via the switching unit 33.

Like the high Q design of the frequency matching networks 27 in the multi-mode and multi-band front-end device 20 in FIG. 2, the first frequency matching network 371, the second frequency matching network 373 and the $n^{th}$ frequency matching network 379 being capable of impedance matched to the required impedance of the first frequency band, the required impedance of the second frequency band and the required impedance of the $n^{th}$ frequency band, respectively, their narrow band high Q design will effectively decrease the loss of the RF signals at the first frequency band, the second frequency band and the $n^{th}$ frequency band transmitted to the first transmission path 321, the second transmission path 323 and the $n^{th}$ transmission path 329 so as to improve the output power and the efficiency of the multi-mode and multi-band front-end device 30 and/or the amplifier unit 21.

In one embodiment of the present invention, the characteristics of the amplifier unit 21 may be adjusted and the switching module 330 may be switched by the control of the control unit 25. For example, the control unit 25 may used for adjusting the gain or bias of the amplifier unit 21, switching the switching module 330 and/or the switching unit 33 according to the frequency band of the RF signal had been amplified by the amplifier unit 21, so as to provide with the appropriate transmission path 32 and the appropriate frequency matching network 37 to transmit the RF signal.

In the multi-mode and multi-band front-end device 30 of the present invention, the impedances of the frequency matching network 37 may be adjusted according to the requirement of frequency band, such that the frequency matching network 37 configured on the same transmission path can provide the appropriate impedances to reduce signal loss in different transmission frequency bands. For example, when the multi-mode and multi-band front-end device 30 is operating at the first transmission frequency band, the amplifier unit 21 will transmit the amplified RF signal at the first frequency band to the input end 331 of the switching module 330 and the input end 331 will be connected to the first connecting end 3331 by the switching of the switching unit 33 within the switching module 330 so as to make the amplifier unit 21 electrically connected to the first frequency matching network 371 configured on the first transmission path 321 via the switching unit 33. Furthermore, when the multi-mode and multi-band front-end device 30 is operating at the other transmission frequency band (such as $1a^{th}$ frequency band), the impedance of the first frequency matching network 371 may be adjusted to match the required impedance of the $1a^{th}$ frequency band, in such a way that the RF signals of multiple frequency bands may be transmitted on the same transmission path, and the impedances of each of frequency bands can reach the result of the better impedance matching. For example, the first frequency band is 2300~2400 MHz, and the $1a^{th}$ frequency band is 2570~2620 MHz. The first frequency matching network 371 will be designed to be impedance matched to the first frequency band (2300~2400 MHz) when the first transmission path 321 is operating at the first frequency band (2300~2400 MHz); otherwise, the first frequency matching network 371 can be adjusted to match to the required impedance of the $1a^{th}$ frequency band (2570~2620 MHz) when the first transmission path 321 is operating at the $1a^{th}$ frequency band (2570~2620 MHz). Thus, the RF signal of the first frequency band (2300~2400 MHz) and the RF signal of the $1a^{th}$ frequency band (2570~2620 MHz) can be selectively transmitted on the transmission path 321 so as to reach the result of impedance matching for two kinds of frequency bands, simultaneously. Wherein, the impedances of the frequency matching networks 37 may be adjusted by the control unit 25 controlling the switching of the switching module 330.

In the embodiment of the present invention, the switching unit 33 and the frequency matching networks 37 are integrated into the switching module 330. For example, the switching module 330 is a single chip, which is made by the process technology of CMOS (Complementary Metal-Oxide-Semiconductor), SOI (Silicon on Insulating substrate), pHEMT (Pseudomorphic High Electric Mobility Transistor) or SiGe. By integrating the switching unit 33 and the frequency matching networks 37 into the switching module 330, the amplifier unit 21 may be provided with the better output efficiency and power to decrease the required number of the SMT (Surface Mount Technology) used in the front-end device 30 and reduce the sizes of the front-end device 30 and a circuit board for configuring the front-end device 30, so that the switching module 330 may be successfully integrated into a single chip.

Figure 5:
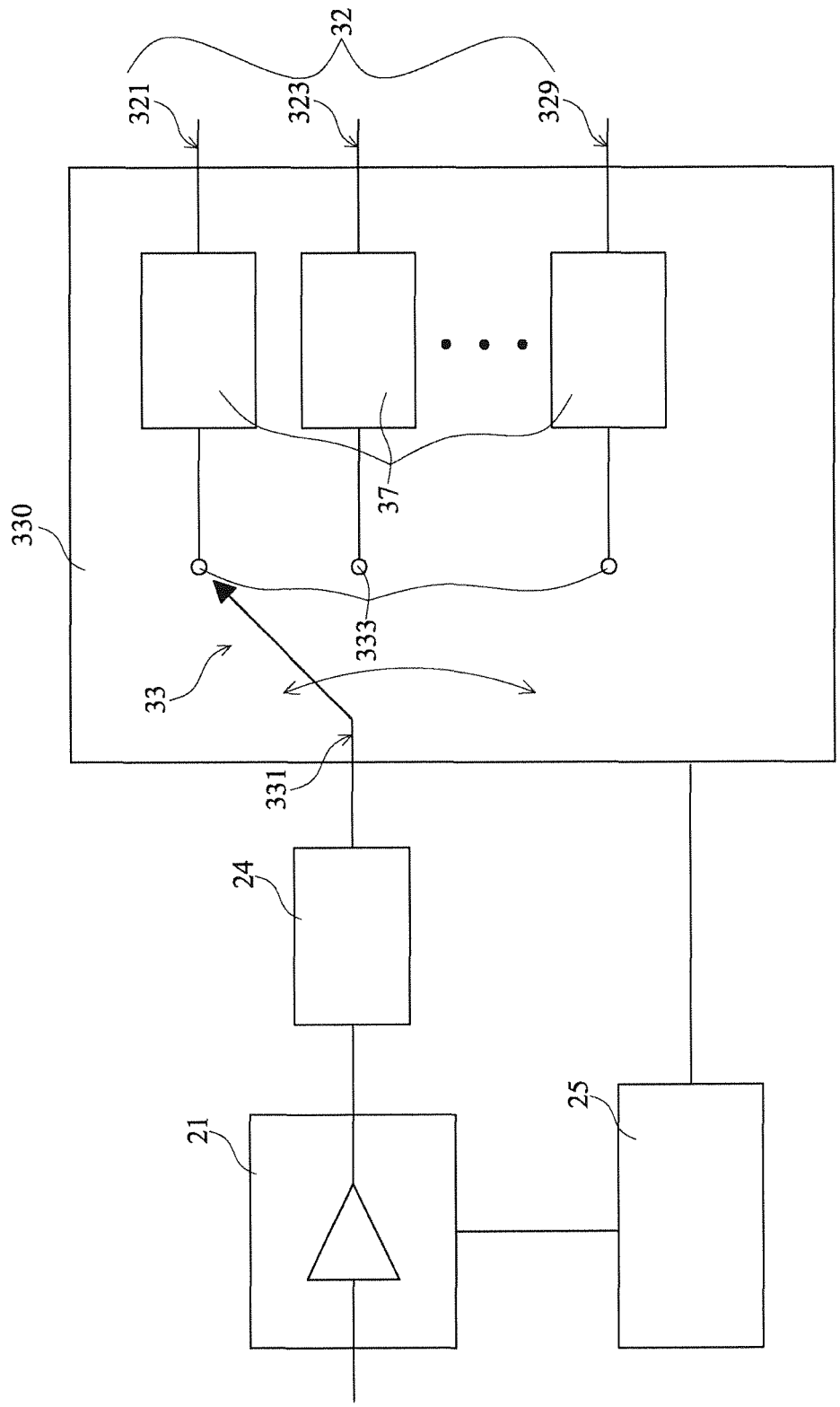
FIG. 5 is a circuit connection diagram of a multi-mode and multi-band front-end device according to another embodiment of the present invention.

In another embodiment of the present invention, as shown in FIG. 5, at least one matching network 24 is further configured between the amplifier unit 21 and the input end 331 of the switching module 330. The output power of the output signal of the amplifier unit 21 may be improved by the using of the matching network 24 and the frequency matching networks 37.

Figure 6:
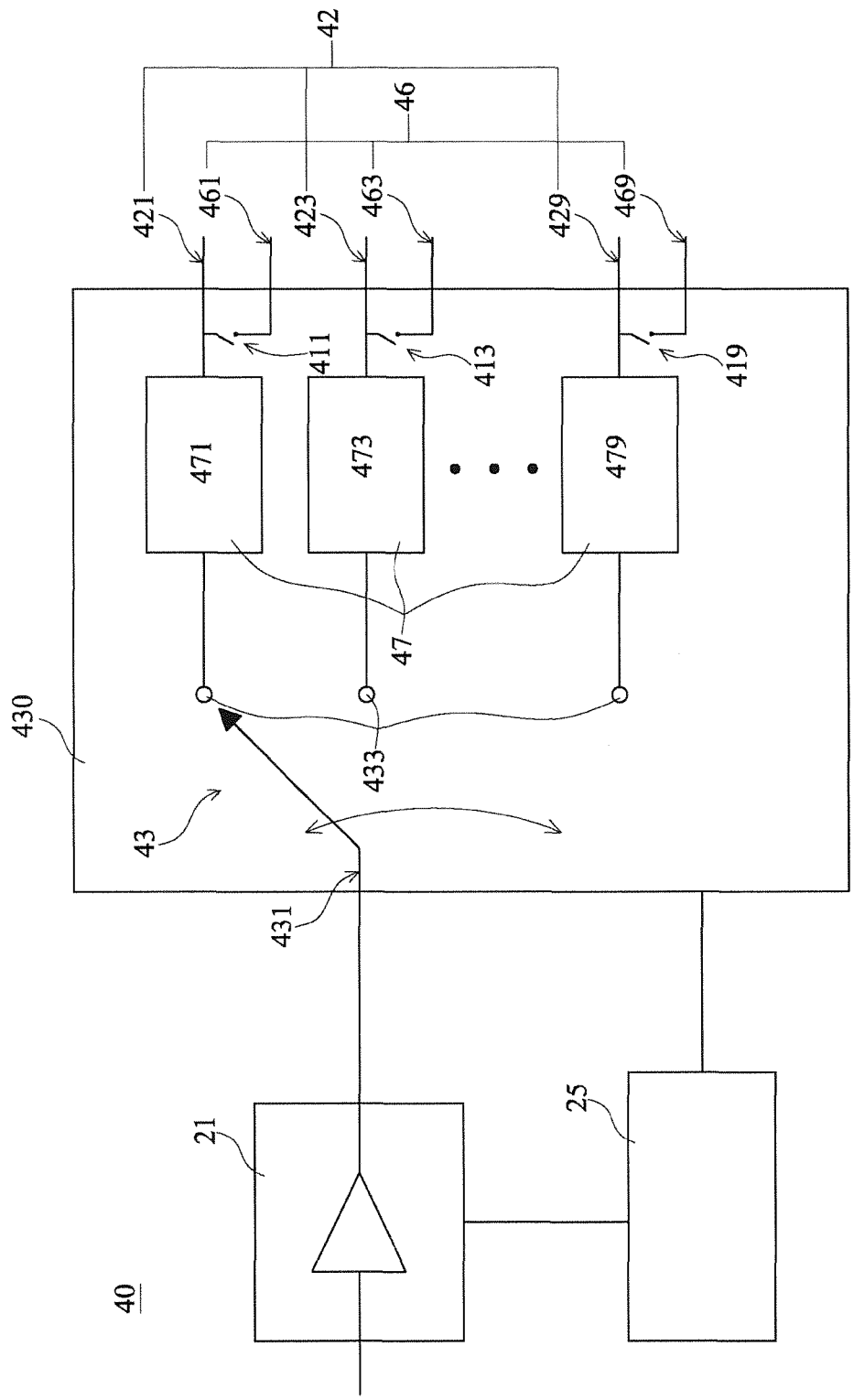
FIG. 6 is a circuit connection diagram of a multi-mode and multi-band front-end device according to another embodiment of the present invention.

Referring to FIG. 6, there is shown a circuit connection diagram of a multi-mode and multi-band front-end device according to another embodiment of the present invention. The multi-mode and multi-band front-end device 40 of the present invention is used for transmitting and receiving the RF signal, and comprises an amplifier unit 21, a switching module 430 and a control unit 25. Wherein the amplifier unit 21 is connected to the switching module 430, and transmits the amplified RF signal to the switching module 430. The control unit 25 is connected to the amplifier unit 21 and the switching module 430, and for controlling the amplifier unit 21 and switching the switching module 430.

The switching module 430 of the embodiment of the present invention comprises a switching unit 43, a plurality of transmission paths 42, a plurality of frequency and transceiver matching networks 47, and a plurality of reception paths 46. Wherein the switching unit 43 comprises an input end 431 and a plurality of connecting ends 433. The input end 431 of the switching unit 43 is connected to the amplifier unit 21, and each of connecting ends 433 of the switching unit 43 is connected to each of transmission paths 42 and/or each of reception paths 46, respectively.

The impedances of each of frequency and transceiver matching networks 47 are with respect to the frequency bands of transmitting signals, and matched to the required impedances of different frequency bands, respectively. In one embodiment of the present invention, each of the frequency and transceiver matching networks 47 is configured on each of transmission paths 42, respectively, so as to make each frequency and transceiver matching network 47 electrically connected to each connecting end 433 of the switching unit 43.

In one embodiment of the present invention, each of reception paths 46 is electrically connected to each of transmission paths 42 and each of frequency and transceiver matching networks 47. For example, the reception paths 46 comprise a first reception path 461, a second reception path 462 and an $n^{th}$ reception path 469. Wherein the first reception path 461 is electrically connected to a first frequency and transceiver matching network 471 and/or a first transmission path 421 via a first switch 411, the second reception path 463 is electrically connected to a second frequency and transceiver matching network 473 and/or a second transmission path 423 via a second switch 413, and the $n^{th}$ reception path 469 is electrically connected to an $n^{th}$ frequency and transceiver matching network 479 and/or an $n^{th}$ transmission path 429 via an $n^{th}$ switch 419.

The transmission way of signal of the multi-mode and multi-band front-end device 40 of the present embodiment is similar to the multi-mode and multi-band front-end device 30 disclosed in FIG. 4, and similarly selects the input end 431 connected to one of the transmission paths 42 and one of the frequency and transceiver matching networks 47 according to the frequency band of signal to be transmitted by the amplifier unit 21. The difference between the devices 30 and 40 is that each of reception paths 46 of the multi-mode and multi-band front-end device 40 is connected to each of transmission paths 42 and each of frequency and transceiver matching networks 47 via the different switch 411/413/419, respectively, such that each switch 411/413/419 will be turned off during transmission of signal.

The multi-mode and multi-band front-end device 40 of the present embodiment may select one of the reception paths 46 to receive the RF signal according to the frequency band of receiving signal. In one embodiment of the present invention, one of the switches 411, 413, 419 is turned on according to the frequency band of receiving signal so as to make one of the reception paths 46 connected to one of the transmission paths 46 and one of the frequency and transceiver matching networks 47. For example, the first switch 411 will be turned on and the other switches 413, 419 will be turned off when the multi-mode and multi-band front-end device 40 is operated for receiving the RF signal at the first frequency band so that the RF signal is transmitted to the first reception path 461 via the first transmission path 421 and the first switch 411. The second switch 413 will be turned on and the other switches 411, 419 will be turned off when the multi-mode and multi-band front-end device 40 is operated for receiving the RF signal at the second frequency band so that the RF signal is transmitted to the second reception path 463 via the second transmission path 423 and the second switch 413. The $n^{th}$ switch 419 will be turned on and the other switches 411, 413 will be turned off when the multi-mode and multi-band front-end device 40 is operated for receiving the RF signal at the $n^{th}$ frequency band so that the RF signal is transmitted to the $n^{th}$ reception path 469 via the $n^{th}$ transmission path 429 and the $n^{th}$ switch 419.

In practical application, each of transmission paths 42 can be electrically connected to the same antenna (not shown) or electrically connected to the differential antenna (not shown), respectively. Wherein the transmission paths 42 can transmit RF signal to the antenna connected thereof. When the multi-mode and multi-band front-end device 40 is operating in transmission mode, the RF signal will be amplified by the amplifier unit 21, then transmitted to the transmission path 42 via the switching module 430, and finally sent out by the antenna. When the multi-mode and multi-band front-end device 40 is operating in reception mode, the amplifier unit 21 will be turn off, each of reception paths 42 will be electrically connected to the same antenna (not shown) or electrically connected to the differential antenna (not shown), respectively, and the reception paths 46 may be received external signals via the antenna and/or parts of the transmission paths 42.

In the multi-mode and multi-band front-end device 40 of the present invention, the impedances of the frequency and transceiver matching networks 47 may be adjusted according to the requirement of system. For example, the impedances of each of the frequency and transceiver matching networks 47 may be matched to the impedances required by each of the transmission paths 42 when the multi-mode and multi-band front-end device 40 is operating in transmission mode, and the impedances of the frequency and transceiver matching networks 47 may be adjust to another impedances when the multi-mode and multi-band front-end device 40 is operating in reception mode such that the impedances from the antenna to the reception paths 46 can achieve the result of impedance matching. So, this design that the impedances of the frequency and transceiver matching networks 47 may be adjusted will make the multi-mode and multi-band front-end device 40 operating in transmission mode and reception mode capable of achieving the better impedance matching, and combining the results of increasing the output power during the transmission mode and decreasing the loss of signal during the reception mode. Wherein, the impedances of the frequency matching networks 47 may be adjusted by the control unit 25 controlling the switching of the switching module 430.

Figure 7:
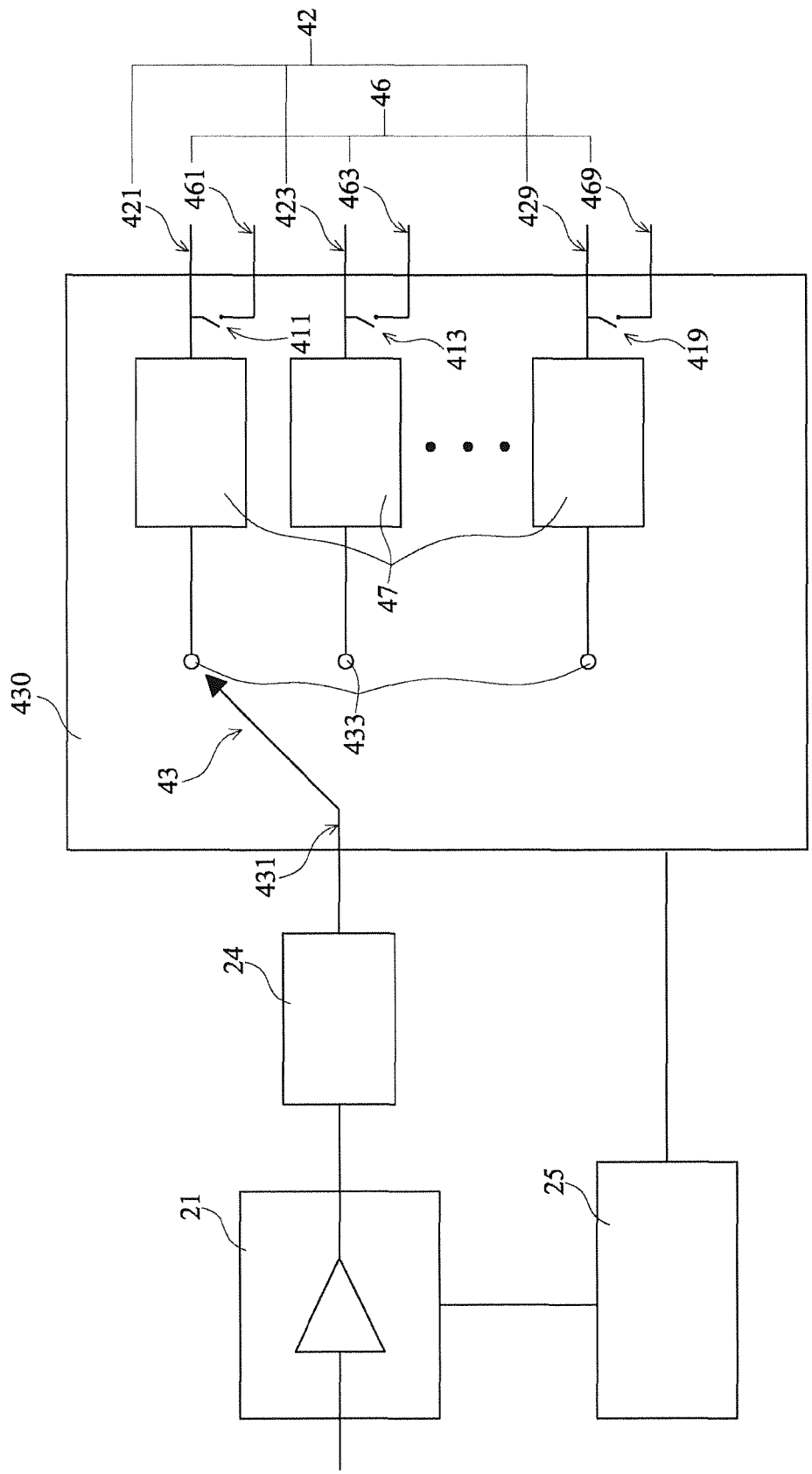
FIG. 7 is a circuit connection diagram of a multi-mode and multi-band front-end device according to another embodiment of the present invention.

In another embodiment of the present invention, as shown in FIG. 7, at least one matching network 24 is further configured between the amplifier unit 21 and the input end 431 of the switching module 430. The output power and the efficiency of the amplifier unit 21 and/or the multi-mode and multi-band front-end device 40 may improved by the using of the matching network 24 and the frequency and transceiver matching networks 47.

Each of frequency and transceiver matching networks 47 of the above-described embodiment of the present invention comprise at least one capacitor, and/or at least one inductor, and/or at least one resistor, and/or at least one switch. Wherein the impedances of the frequency and transceiver matching networks 47 may be fixed or adjusted. The detailed contents will be described in subsequent embodiments.

In the embodiment of the present invention, the switching unit 43 and the frequency and transceiver matching networks 47 are integrated into the switching module 430. For example, the switching module 430 is integrated into a single chip, which is made by the process technology of CMOS (Complementary Metal-Oxide-Semiconductor), SOI (Silicon on Insulating substrate), pHEMT (Pseudomorphic High Electric Mobility Transistor) or SiGe.

Referring to FIGS. 8A to 8C, there are shown each circuit connection diagram of a frequency matching network and a frequency and transceiver matching network of a multi-mode and multi-band front-end device according to one embodiment of the present invention, respectively. Referring to FIGS. 2 to 5, cooperatively, each frequency matching network 27/37 is connected at one end thereof to each corresponding connecting end 233/333 and connected at another end thereof to each corresponding transmission path 22/32. Referring to FIG. 6 and FIG. 7, cooperatively, each frequency and transceiver matching network 47 is connected at one end thereof to each corresponding connecting end 433 and connected at another end thereof to each corresponding transmission path 42 and/or each corresponding reception path 46.

In the embodiment of the present invention, the impedances of the frequency matching network 27/37 and the frequency and transceiver matching network 47 may be adjusted according to the frequency band of receiving and/or transmitting RF signal. Each frequency matching network 27/37 and each frequency and transceiver matching network 47 comprise at least one first passive element 3701, respectively. The first passive element 3701 is connected at one end thereof to the transmission path 22/32/42, the connecting end 233/333/433 and/or the reception path 46, and connected at another end thereof to grounding end.

In one embodiment of the present invention, as shown in FIG. 8A, the frequency matching network 27/37 and the frequency and transceiver matching network 47 are not configured with any switch therein, such that the impedances of the frequency matching network 27/37 and the frequency and transceiver matching network 47 are fixed. In different embodiment of the present invention, as shown in FIGS. 8B and 8C, the frequency matching network 27/37 and the frequency and transceiver matching network 47 are configured with at least one switch 3702 therein. For example, the first passive element 3701 is connected to the transmission path 22/32/42 or grounding end via the switch 3702, in such a way the first passive element 3701 can be controlled to electrically connect to the transmission path 22/32/42 or grounding end by turning on or off the switch 3702 so as to adjust the impedances of the frequency matching network 27/37 and the frequency and transceiver matching network 47. Furthermore, the number of the first passive elements 3701 or the switches 3702 may be multiple, as shown in FIG. 8C.

Referring to FIGS. 9A to 9C, there are shown each circuit connection diagram of a frequency-matching network of a multi-mode and multi-band front-end device according to another embodiment of the present invention, respectively. Referring to FIGS. 2 to 5, cooperatively, each frequency matching network 27/37 is connected at one end thereof to each corresponding connecting end 233/333 and connected at another end thereof to each corresponding transmission path 22/32. Referring to FIGS. 6 and 7, cooperatively, each frequency and transceiver matching network 47 is connected at one end thereof to each corresponding connecting end 433 and connected at another end thereof to each corresponding transmission path 42 and/or each corresponding reception path 46.

In the embodiment of the present invention, each frequency matching network 27/37 and each frequency and transceiver matching network 47 comprise at least one first passive element 3701 and at least one second passive element 3703, respectively. Wherein the first passive element 3701 is connected at one end thereof to the transmission path 22/32/42, the connecting end 233/333/433 and/or the reception path 46, and connected at another end thereof to grounding end. The second passive element 3703 is configured on the transmission path 22/32/42, such as the second passive element 3703 is connected at one end thereof to the connecting end 233/333/433 and/or the first passive element 3701, and connected at another end thereof to the transmission path 22/32/42 and/or the reception path 46.

In the embodiment of FIG. 9A, the frequency matching network 27/37 and the frequency and transceiver matching network 47 are not configured with any switch therein, such that the impedances of the frequency matching network 27/37/47 may be fixed. In the different embodiment of FIGS. 9B and 9C, the frequency matching network 27/37 or the frequency and transceiver matching network 47 is configured with at least one switch 3702 therein. For example, the first passive element 3701 is connected to the transmission path 22/32/42 or grounding end via the switch 3702, in such a way the first passive element 3701 may be controlled to electrically connect to the transmission path 22/32/42 or grounding end by turning on or turning off the switch 3702 so as to adjust the impedances of the frequency matching network 27/37 and the frequency and transceiver matching network 47.

Figures 10A, 10B, 10C:
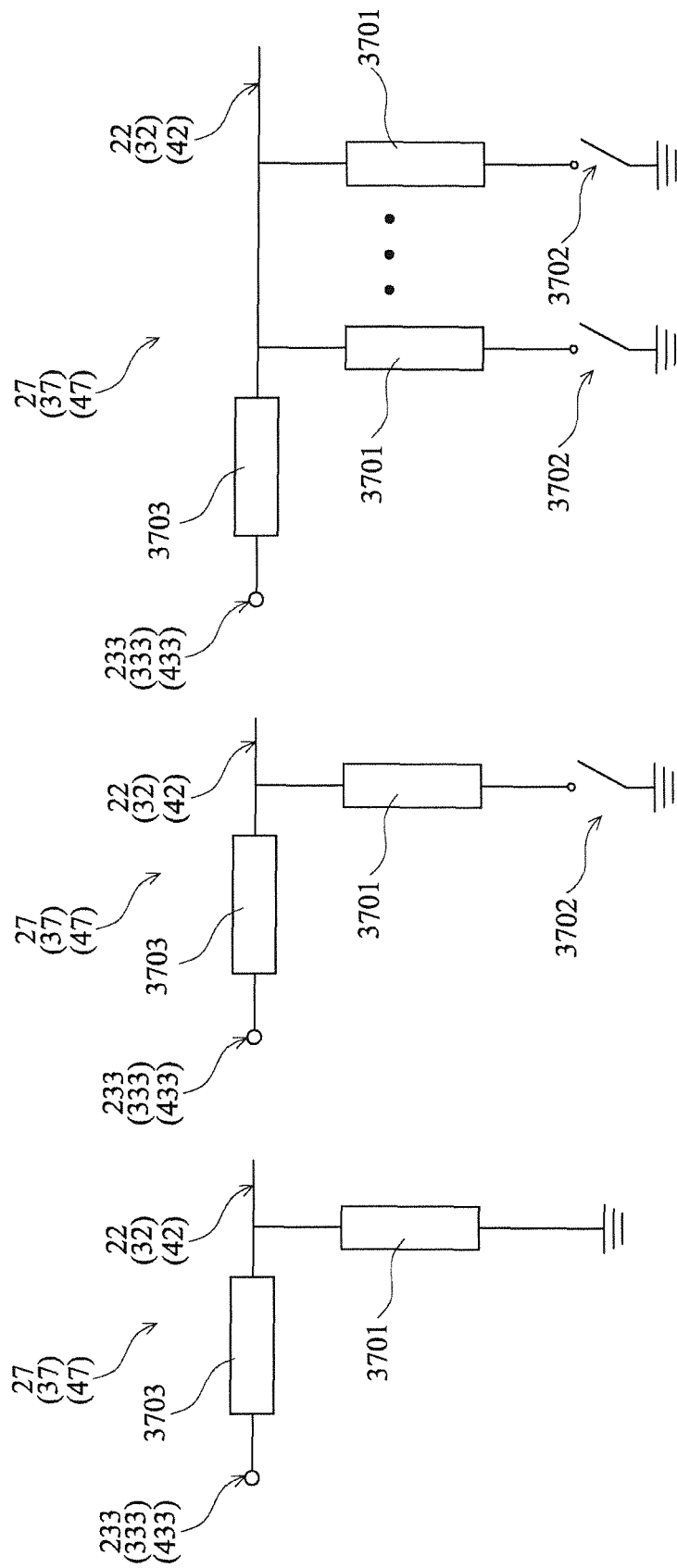
FIGS. 10A to 10C are each circuit connection diagram of a frequency matching network and a frequency and transceiver matching network of a multi-mode and multi-band front-end device according to another embodiment of the present invention, respectively.

In another embodiment of the present invention, as shown in FIGS. 10A to 10C, each frequency matching network 27/37 and each frequency and transceiver matching network 47 comprise at least one first passive element 3701 and at least one second passive element 3703, respectively. Wherein the first passive element 3701 is connected at one end thereof to the transmission path 22/32/42, the connecting end 233/333/433 and/or the reception path 46, and connected at another end thereof to grounding end. The second passive element 3703 is connected at one end thereof to the connecting end 233/333/433, and connected at another end thereof to the transmission path 22/32/42, the reception path 46 and/or the first passive element 3701. Furthermore, the number of the first passive elements 3701, the second passive elements 3703 and/or the switches 3702 may be multiple, as shown in FIGS. 9C and 10C.

In the embodiment of the present invention, the first passive element 3701 and the second passive element 3703 may be capacitors, and/or inductors and/or resistors. By the combination of capacitors, and/or inductors and/or resistors, the frequency matching network 27/37 and the frequency and transceiver matching network 47 may achieve impedance matching at a specific frequency band, or the frequency and transceiver matching network 47 may achieve impedance matching to the transmission path and the reception path, respectively.

In one embodiment of the present invention, the switch 3702 within the frequency matching network 27/37 and the frequency and transceiver matching network 47 may be selectively switched according to the frequency band of RF signal to be transmitted by the multi-mode and multi-band front-end device 20/30/40 so as to adjust the impedances of the frequency matching network 27/37 and the frequency and transceiver matching network 47, in such a way that the frequency matching network 27/37 and the frequency and transceiver matching network 47 may be capable of achieving impedance matching to the frequency band of signal to be transmitted so that the output power and PAE of the multi-mode and multi-band front-end device 20/30/40 and the amplifier unit 21 may be improved.

In another embodiment of the present invention, the switch 3702 within the frequency and transceiver matching network 47 may be selectively switched according to the frequency band of RF signal to be transmitted and/or received by the multi-mode and multi-band front-end device 40 and the required impedances of the multi-mode and multi-band front-end device 40 to adjust the impedances of the frequency and transceiver matching network 47, in such a way that the frequency and transceiver matching network 47 may be capable of achieving the object of impedance matching to the frequency band of signal to be transmitted and/or received, so that improving the output power of the multi-mode and multi-band front-end device 40 and the amplifier unit 21 in transmission mode, and reducing the signal loss of the multi-mode and multi-band front-end device 40 operated in the reception mode, and increasing the sensitively of reception signal of the multi-mode and multi-band front-end device 40.

In the present invention, the connection means is directly connected or indirectly connected between one or more objects or components. For example, one or more intermediate connection objects are configured between one or more objects or components.

It is to be understood that the terminology used herein is for the purpose of describing particular embodiments only, and is not intended to be limiting. As used in this specification, the singular forms "a", "an" and "the" include plural referents unless the content clearly indicates otherwise. For example, "a component" mentioned in specification includes a combination of two or more components and "a material" mentioned in specification includes mixtures of materials.

The foregoing description is merely one embodiment of the present invention and not considered as restrictive. All equivalent variations and modifications in shape, structure, feature, and spirit in accordance with the appended claims may be made without in any way from the scope of the invention.

The invention claimed is:

1. A multi-mode and multi-band front-end device, used for transmitting Radio Frequency (RF) signal, comprising:
   an amplifier unit;
   a switching unit, including at least one input end and a plurality of connecting ends, wherein said input end of said switching unit is electrically connected to said amplifier unit;
   a control unit, connected to said amplifier unit and said switching unit, and used for controlling said amplifier unit and said switching unit;
   a plurality of transmission paths, connected to said connecting ends of said switching unit, respectively; and
   a plurality of frequency matching networks, configured on each of said transmission paths, respectively, wherein each of said frequency matching networks is impedance matched to the required impedances of different frequency bands, respectively;
   wherein each of said frequency matching networks includes at least one first passive element connected at one end thereof to said corresponding transmission path.

2. The multi-mode and multi-band front-end device according to claim 1, wherein impedances of said frequency matching networks may be adjusted according to the frequency bands of the RF signals.

3. The multi-mode and multi-band front-end device according to claim 1, wherein each of said frequency matching networks includes at least one second passive element configured on said corresponding transmission path.

4. The multi-mode and multi-band front-end device according to claim 3, wherein said first passive element and said second passive element are capacitors or inductors or resistors.

5. The multi-mode and multi-band front-end device according to claim 1, wherein said first passive element is connected to said corresponding transmission path or grounding end via a switch, and said switch is for controlling said first passive element electrically connected to said corresponding transmission path or grounding end so as to adjust the impedances of said frequency matching networks.

6. A multi-mode and multi-band front-end device, used for transmitting Radio Frequency (RF) signal, comprising:
    an amplifier unit;
    a switching module, including:
        a switching unit, including an input end and a plurality of connecting ends, wherein said input end of said switching unit is electrically connected to said amplifier unit;
        a plurality of transmission paths, connected to said connecting ends of said switching unit, respectively; and
        a plurality of frequency matching networks, configured on each of said transmission paths, respectively, wherein each of said frequency matching networks is impedance matched to the required impedances of different frequency bands, respectively; and
    at least one control unit, connected to said amplifier unit and said switching module;
        wherein each of said frequency matching networks includes at least one first passive element connected at one end thereof to said corresponding transmission path.

7. The multi-mode and multi-band front-end device according to claim 6, wherein impedances of said frequency matching networks may be adjusted according to the frequency bands of the RF signals.

8. The multi-mode and multi-band front-end device according to claim 6, wherein each of said frequency matching networks comprises includes at least one second passive element configured on said corresponding transmission path.

9. The multi-mode and multi-band front-end device according to claim 8, wherein said first passive element and said second passive element are capacitors or inductors or resistors.

10. The multi-mode and multi-band front-end device according to claim 6, wherein said first passive element is connected to said corresponding transmission path or grounding end via a switch, and said switch is for controlling said first passive element electrically connected to said corresponding transmission path or grounding end so as to adjust the impedances of said frequency matching networks.

11. The multi-mode and multi-band front-end device according to claim 6, wherein said switching module is integrated into a single chip.

12. The multi-mode and multi-band front-end device according to claim 11, wherein said switching module is integrated into the single chip based on the process of CMOS or SOI or pHEMT or SiGe.

13. A multi-mode and multi-band front-end device, used for transmitting and receiving Radio Frequency (RF) signal, comprising:
    an amplifier unit;
    a switching module, including:
        a switching unit, including an input end and a plurality of connecting ends, wherein said input end of said switching unit is electrically connected to said amplifier unit;
        a plurality of transmission paths, connected to said connecting ends of said switching unit, respectively; and
        a plurality of frequency and transceiver matching networks, configured on each of said transmission paths, respectively, wherein each of said frequency and transceiver matching networks is impedance matched to the required impedances of different frequency bands, respectively; and
        a plurality of reception paths, connected to each of said transmission paths, respectively; and
    at least one control unit, connected to said amplifier unit and said switching module;
        wherein each of said frequency and transceiver matching networks includes at least one first passive element connected at one end thereof to said corresponding transmission path.

14. The multi-mode and multi-band front-end device according to claim 13, wherein impedances of said frequency and transceiver matching networks may be adjusted according to the frequency bands of the RF signals.

15. The multi-mode and multi-band front-end device according to claim 13, wherein each of said frequency matching networks includes at least one second passive element configured on said corresponding transmission path.

16. The multi-mode and multi-band front-end device according to claim 15, wherein said first passive element and said second passive element are capacitors or inductors or resistors.

17. The multi-mode and multi-band front-end device according to claim 13, wherein said first passive element is connected to said corresponding transmission path or grounding end via a switch, and said switch is for controlling said first passive element electrically connected to said corresponding transmission path or grounding end so as to adjust the impedances of said frequency matching networks.

18. The multi-mode and multi-band front-end device according to claim 13, wherein each of said reception paths is electrical connected to each of said transmission paths via a switch.

19. The multi-mode and multi-band front-end device according to claim 13, wherein said switching module is integrated into a single chip.

20. The multi-mode and multi-band front-end device according to claim 19, wherein said switching module is integrated into the single chip based on the process of CMOS or SOI or pHEMT or SiGe.

* * * * *